United States Patent
Gaddam et al.

(10) Patent No.: US 10,860,473 B1
(45) Date of Patent: Dec. 8, 2020

(54) MEMORY TRAFFIC ANALYZER

(71) Applicant: XILINX, INC., San Jose, CA (US)

(72) Inventors: Ramakrishna R. Gaddam, Hyderabad (IN); Santosh K. Parasurampuram, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/542,893

(22) Filed: Aug. 16, 2019

(51) Int. Cl.
 G06F 13/00 (2006.01)
 G06F 13/28 (2006.01)
 G06F 12/02 (2006.01)
 G06F 13/20 (2006.01)

(52) U.S. Cl.
 CPC ............ G06F 12/023 (2013.01); G06F 13/20 (2013.01); *G06F 2212/65* (2013.01); *G06F 2213/16* (2013.01)

(58) Field of Classification Search
 CPC combination set(s) only.
 See application file for complete search history.

(56) References Cited

U.S. PATENT DOCUMENTS

| | | |
|---|---|---|
| 7,720,636 B1 | 5/2010 | Baxter et al. |
| 7,913,022 B1 | 3/2011 | Baxter |
| 9,081,925 B1 | 7/2015 | Schumacher et al. |
| 9,529,946 B1 | 12/2016 | Schumacher et al. |

*Primary Examiner* — Yong J Choe
(74) *Attorney, Agent, or Firm* — Patterson + Sheridan, LLP

(57) ABSTRACT

Examples herein describe a method for memory address mapping. In one embodiment, the method includes selecting a bank group subset of bits from a plurality of bits that represent a memory address; selecting a bank address subset of bits from the plurality of bits; selecting a column subset of bits from the plurality of bits, wherein the column subset of bits is exclusive from the bank group subset of bits and the bank address subset of bits; and generating an optimal memory address mapping for converting system memory addresses into the plurality of local memory addresses for the memory banks using the bank group subset of bits, the bank address subset of bits, and the column subset of bits.

20 Claims, 12 Drawing Sheets

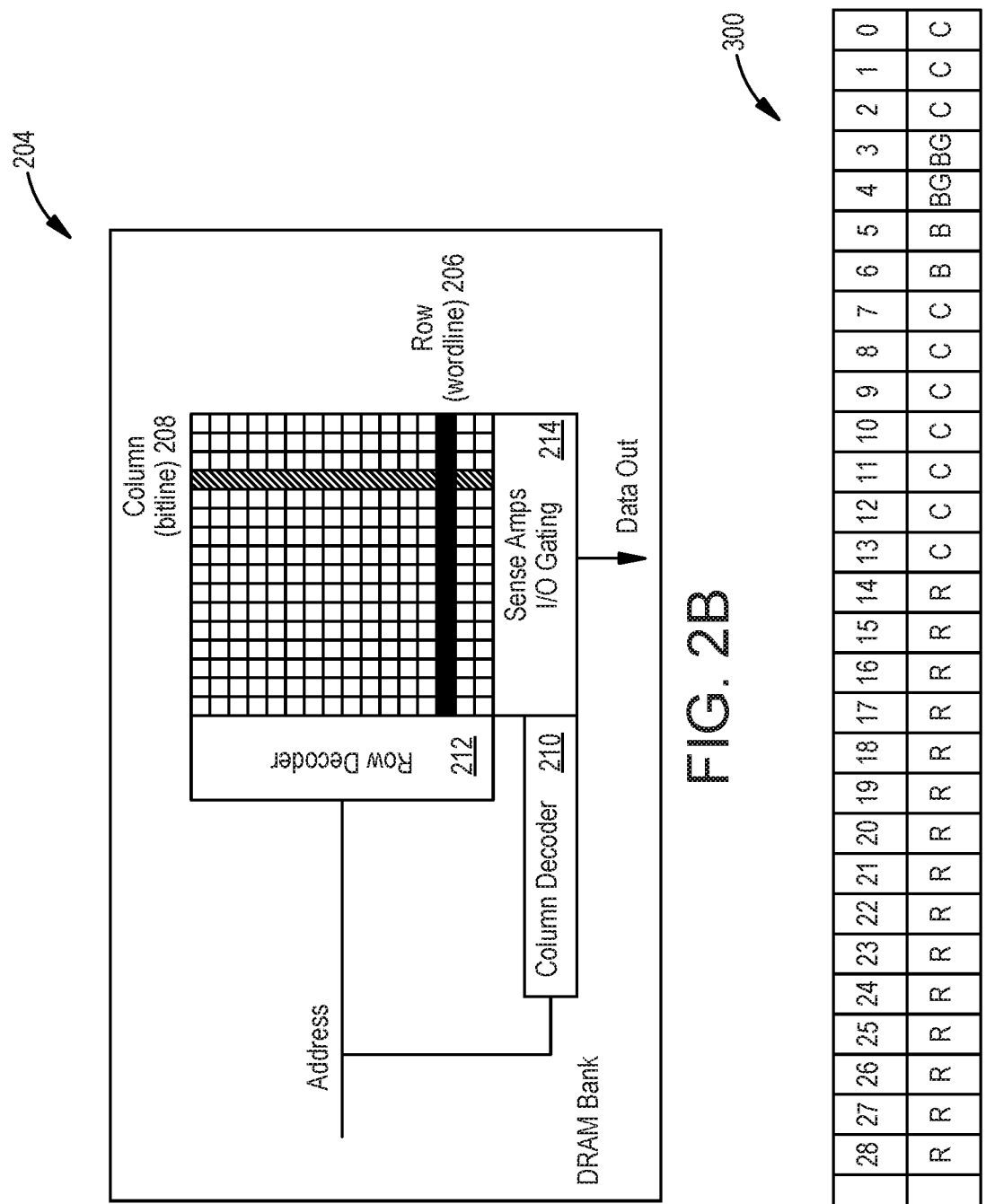

MEMORY TRAFFIC ANALYZER

TECHNICAL FIELD

Examples of the present disclosure generally relate to memory address mapping and, in particular, to analyzing memory traffic for generating an optimal memory mapping.

BACKGROUND

DDR4 memories are widely used for system memory needs, as they offer higher densities with higher bandwidths at lower prices. Though they operate at higher data rates, their architecture has certain access overheads that limit the memory bandwidth. These overheads are a direct function of access patterns that appear at the DRAM controller and as these overheads increase, system performance decreases in efficiency. Majority of these overheads can be avoided or reduced with proper system address to memory address mapping. Hence, optimal mapping of the system address to the memory address is important for achieving higher system performance.

There are some memory address mapping methods such as ROW_COLUMN_BANK (RCB), BANK_ROW_COLUMN (BRC), etc. RCB is preferred when the address in the least significant bit positions toggle frequently so the switching activity is more in bank groups. Similarly, BRC is recommended when there is high toggle activity in the most significant bit positions. However, neither of these address methods provide better bandwidth when memory accesses are random. The typical practice in these scenarios involves manually analyzing the traffic sequence/patterns to determine a customized address mapping. This manual analysis requires a lot of human effort depending on the traffic patterns, and does not guarantee the optimal address mapping.

SUMMARY

A method for memory address mapping is disclosed. In one embodiment, the method includes: selecting a bank group subset of bits from a plurality of bits that represent a memory address, wherein determining the bank group subset comprises computing a standard deviation for a plurality of bank groups and a row toggle rate for each bank group when accessing data in the plurality of bank groups using a plurality of local memory addresses; selecting a bank address subset of bits from the plurality of bits by computing a standard deviation for a plurality of banks of each bank group and a row toggle rate for each bank of the plurality of banks of each bank group when accessing the data; selecting a column subset of bits from the plurality of bits using the address toggle rate for each bank of the plurality of banks, wherein the column subset of bits is exclusive from the bank group subset of bits and the bank address subset of bits; and generating an optimal memory address mapping for converting system memory addresses into the plurality of local memory addresses for the memory banks using the bank group subset of bits, the bank address subset of bits, and the column subset of bits.

Aspects of this present disclosure also provide apparatus, methods, processing systems, and computer readable mediums for performing the operations described above.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 2b illustrates an example setup of a memory bank, according to embodiments of the present disclosure.

FIG. 3 is an example system address and DRAM address mapping, according to embodiments of the present disclosure.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
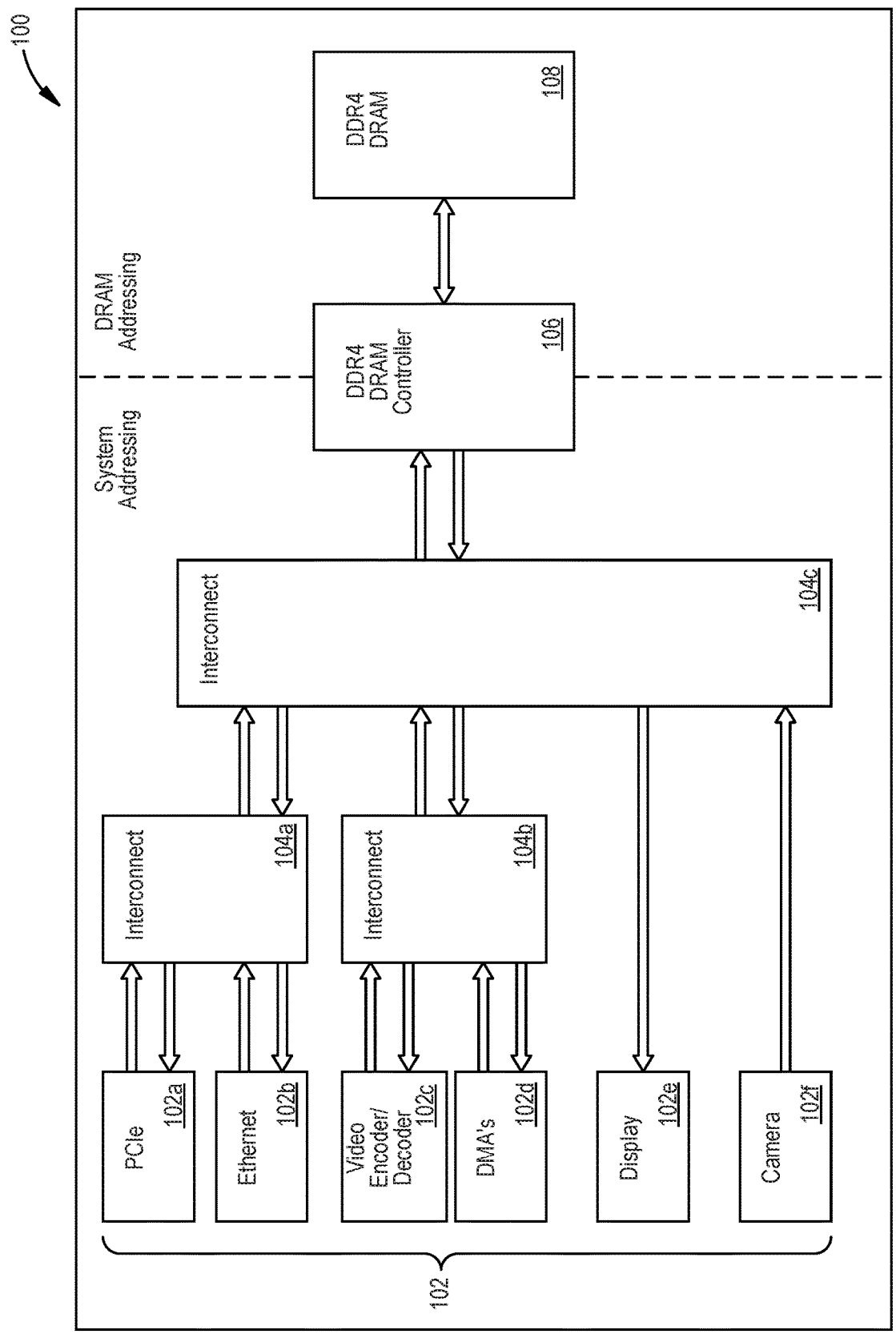
FIG. 1 is an example processing system with multiple master controllers.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have the aspects or advantages shown. An aspect or an advantage described in conjunction with a particular example is not necessarily limited to that example and can be practiced in any other examples even if not so illustrated, or if not so explicitly described.

Embodiments herein describe a memory traffic analyzer that analyzes system traffic at the memory controller to determine an optimal mapping of system memory addresses to local memory addresses that produces higher memory bandwidth to meet system performance requirements. The memory traffic analyzer parses through exemplary system traffic, and based on the exemplary system traffic, determines metrics for various bits of memory addresses used. With the metrics for the various memory address bits, the traffic analyzer determines the optimal memory address mapping and generates an optimal memory address mapping. During operation, the traffic analyzer converts the system memory addresses to local memory addresses using the optimal memory address mapping.

Such a memory traffic analyzer solves many system performance challenges. Because such a memory traffic analyzer replaces the manual approach of analyzing system traffic, it may generate an optimal solution faster than the manual approach. Also, embedding the memory traffic analyzer in a memory controller wizard allows the user to analyze system traffic during the design configuration of a system using the memory traffic analyzer, so that the conversion of system memory addresses to local memory addresses can occur during design configuration, instead of runtime.

FIG. 1 is an example processing system with multiple master controllers accessing data in memory. The processing system 100 includes multiple master controllers 102, such as PCIe, Ethernet, video encoder/decoder, DMA's, display, and camera. Each of these master controllers 102 (102a, 102b, 102c, 102d, 102e) communicate with the memory controller 106 through one or more interconnects 104 (104a, 104b, 104c) in order to access data in memory 108, and the number of interconnects 104 depends on the master controllers 102. For example, PCIe and Ethernet master controllers 102a and 102b communicate with the memory controller 106 through two interconnects 104a, 104c while the display controller 102e and the camera controller 102f communicate with the memory controller 106 through one interconnect 104c.

With multiple master controllers 102, there is often no single memory address mapping that suits all types of system traffic patterns, so system traffic with multiple master controllers 102 often needs to be analyzed before determining an optimal memory address mapping. For example, system traffic from a single master controller would be simple because it can be analyzed manually. However, the system traffic in a data-intensive application with multiple master controllers 102 such as video encoders/decoders, display interfaces, PCIe, Ethernet, and other DMA blocks is complex and not suitable for manual analysis. Each of the master controllers 102 has its own bandwidth requirements and transaction addressing to memory 108 (e.g., linear, multi-thread, linked list, random). Accordingly, the accumulated system traffic becomes complicated at the memory controller 106 when handling data access transactions from the multiple master controllers 102.

Accordingly, the traffic analyzer disclosed herein accounts for any number and type of master controllers that accesses memory 108 through the memory controller 106.

Figure 2A:
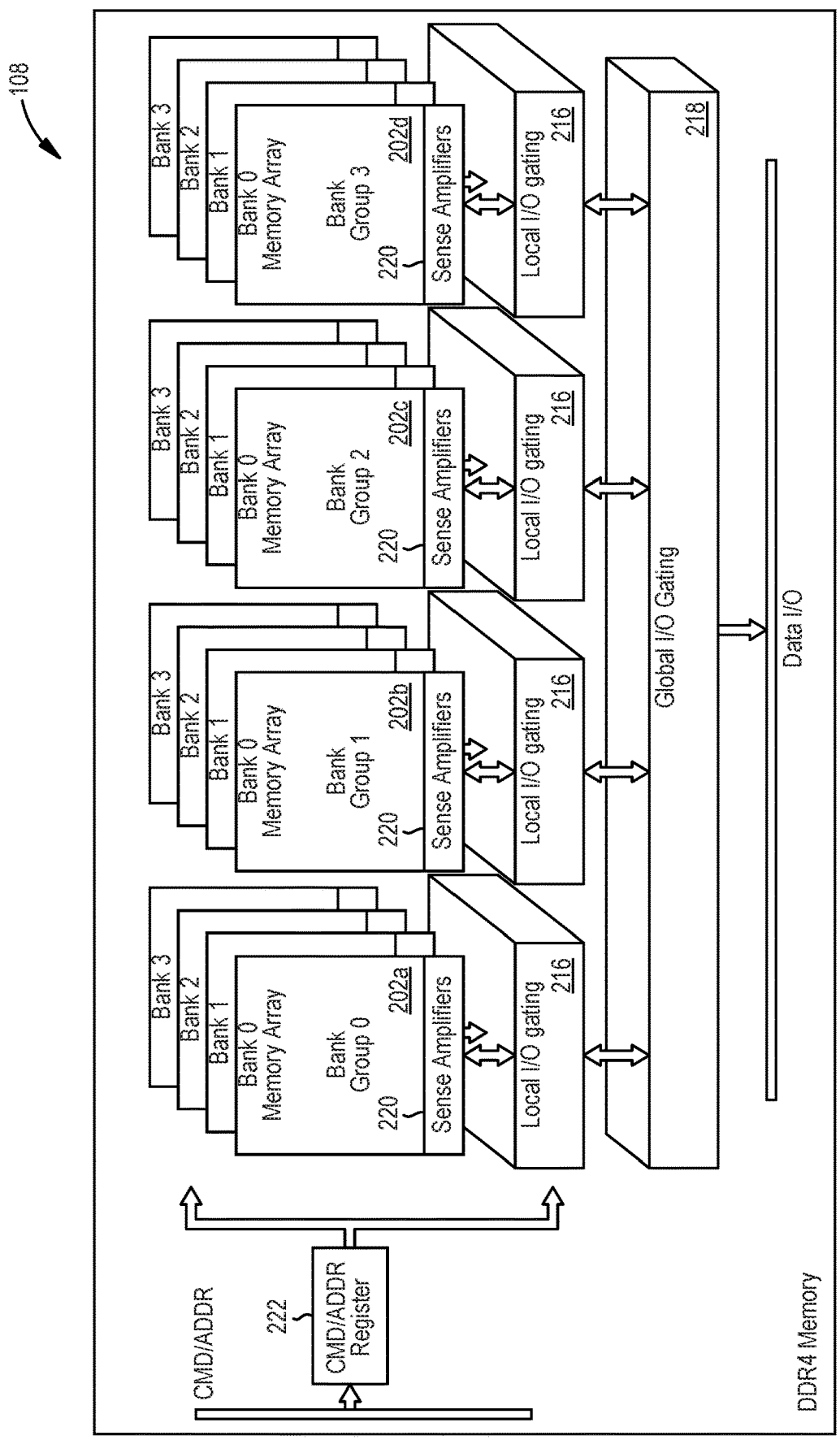
FIG. 2a illustrates an example data flow and setup of memory bank groups and banks, according to embodiments of the present disclosure.

FIGS. 2a and 2b illustrate example data flows and setups of memory banks and bank groups, according to embodiments of the present disclosure, which constitute memory 108 of FIG. 1. While FIGS. 2a and 2b illustrate memory 108 as Double Data Rate Fourth Generation (DDR4) Dynamic Random Access Memory (DRAM), the memory traffic analyzer disclosed herein can be used with any type of memory structures, such as synchronous dynamic random access memory (SDRAM), block or bridging random-access memory (BRAM), or any generation of Double Data Rate (DDR) memory. The present disclosure uses DDR4 memory as exemplary memory, but is not limited to DDR4 memory and can apply to any type of memory structure.

As illustrated in FIGS. 2a and 2b, DDR4 memories have specific structures that cause different access overhead for accessing different parts of the memory. Memory 108 (e.g., DDR4 memory) comprises bank groups 202, banks 204, rows 206, and columns 208. Memory 108 can have any number of bank groups, and DRAM generally has multiple bank groups (e.g., four bank groups). Each bank group 202a, 202b, 202c, 202d can have any number of banks, and the bank groups 202 of the DDR4 memory 108 in FIG. 2a each comprises four banks 204. Each bank 204 is a group of multiple pages, and can have any number of pages. Generally, only a single page of a bank can be accessed at a time, but different pages can be opened in all banks simultaneous in a bank group. A page (referred herein as a row 206 or a wordline) is data organized in rows 206 (also referred to as wordlines) For example, FIG. 2b illustrates a DRAM bank 204 with rows 206 and columns 208, and each cell is a single addressable memory location and can be found by identifying the row and column in the DRAM bank. A DRAM bank 204 can also have a row decoder 212, a column decoder 210, and sense amps and I/O gating 214 for accessing the data at any addressable memory location in the bank 204.

With some memory structures, each bank group 202 can also have local I/O gating 216, which then communicates with global I/O gating 218. Global I/O gating 218 in turn transmits and receives data access transactions from the memory controller 106. Some memory structures also have a register 222 which communicates the memory address to access to the local I/O gating 216 and the banks 204.

The infrastructure of memory 108 as described above can cause overhead limitations based on the physical location of data stored in memory 108. For example, sequential transactions to the same bank group require certain amount of delay called tCCD_L (long cas_n to cas_n delay) and this delay causes drops in performance. Meanwhile, transactions to different bank groups can occur back to back without a loss to system performance. Accordingly, higher sequential switching between bank groups 202 is preferred to avoid delays (e.g., tCCD_L) and using more bank groups 202 enables accessing different pages of memory of different banks of different bank groups simultaneously.

Another overhead limitation involves limitations on data access. For example, a page of a bank 204 must be "opened" before it can be accessed (referred herein as an open page hit). A page miss occurs when a transaction to a new page in the same bank and bank group requires closing the current page (referred to as precharge) and opening the new page (referred to as activate), which incurs delay. Accordingly, minimizing page misses improve system performance. As illustrated in FIG. 2a, memory 108 can have 16 banks grouped into four bank groups 202 and can have a maximum of 16 pages opened simultaneously. Maximizing bank and bank group usage minimizes page misses and hides the overhead when the memory controller 106 accesses data in memory 108.

Accordingly, an optimal address mapping is one that results in the least possible bank group access overhead and page miss overhead, out of all possible address mapping combinations.

FIG. 3 is an example system address and memory address mapping 300 used by the memory controller 106 of FIG. 1 to access data in memory 108 of FIG. 2. The memory address mapping 300 can be used to identify a particular memory location in memory 108. A memory controller (e.g., the DRAM controller 106 in FIG. 1) uses the memory address mapping 300 to convert a system memory address into a local memory address. The memory address mapping 300 can have the same number of bits as the system address as illustrated, and can use any combination or arrangement of bits to identify the particular memory location. For example, bits 3-4 of the memory address mapping 300 identify the bank group, bits 5-6 of the memory address mapping 300 identify the bank of the bank group, bits 14-28 of the memory address mapping 300 can identify the row, and bits 0-3 and 7-13 of the memory address mapping 300 identify the column of the data to access. FIG. 3 shows that any combination of bits of the system address can be used in the memory address mapping 300 to identify the bank group, bank, column, and row of data to be accessed.

Figure 4:
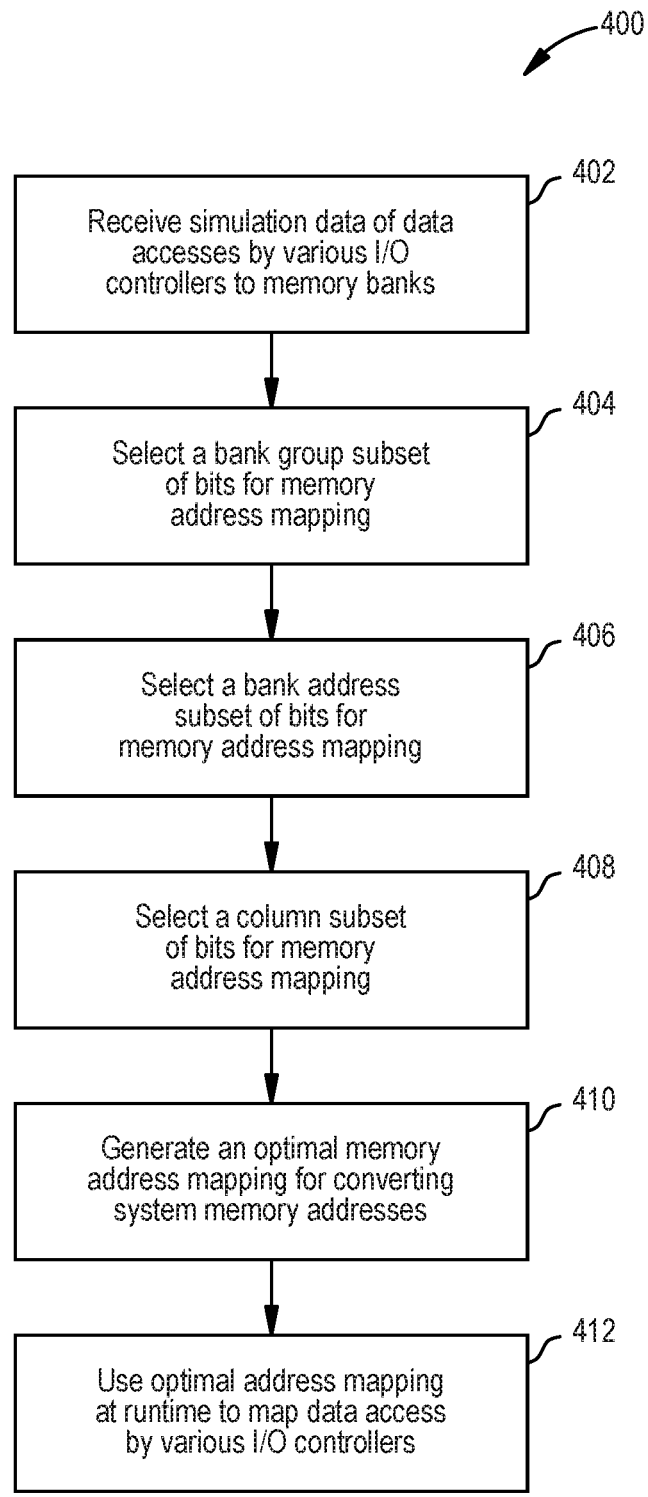
FIG. 4 illustrates example operations performed by a memory controller, according to embodiments of the present disclosure.

FIG. 4 illustrates example operations of the traffic analyzer disclosed herein to generating an optimal memory address mapping from memory traffic patterns such as the memory address mapping of FIG. 3 for a processing system (e.g., processing system 100 of FIG. 1), according to embodiments of the present disclosure. In certain embodiments, the traffic analyzer is a part of the memory controller 106, and in other embodiments, the traffic analyzer is hosted on a computing device configured to design and emulate memory. In some embodiments, the memory controller can be the memory controller 106 of FIG. 1, and the memory controller accesses data in memory 108 of FIG. 1. While the operations of the traffic analyzer are generally performed prior to implementation and during design, in other embodiments these operations can be performed in real-time.

When determining the optimal memory address mapping, traffic analysis may be performed on all possible memory address mappings, and the computation of the permutations and combinations of all possible memory address mappings can use large amounts of processing time. Specifically, the number of combinations of "n" bits taken "r" at a time is expressed as:

$$C(n, r) = \frac{n!}{r!\,(n-r)!}.$$

For example "A" is the width of the address bits that need to be mapped with 2 bits for bank groups, 2 bits for banks, 7 bits for columns, and the rest of the bits for the rows. In such example, the number of combinations for bank group bits for memory address mapping of width A is C(A, 2), the number of combinations for bank bits for memory address mapping of width A is C(A−2, 2), and the number of combinations of column bits for memory address mapping of width A is C(A−9, 7). Accordingly, the number of combinations for computation is C(A, 2)×C(A−2, 2)×C(A−9, 7).

Because the number of combinations is large, the traffic analyzer uses a two stage approach to determine the optimal address mapping with reduced number of computations to achieve better performance. In the first stage, the traffic analyzer selects various address mappings for bank group bits of the system memory address to analyze the system traffic, and selects bank group bits based on the results from iterations of address mappings. In the second stage, the traffic analyzer selects various address mappings for bank bits from the system memory address to analyze the system traffic, and selects bank, row, and column bits based on the results from iterations of address mappings. This two-stage approach results in the number of combinations for computation to be C(A, 2)+C(A−2,2). As discussed below, the traffic analyzer executes operations 400 for this two-stage approach.

Operations 400 begin, at 402, when the traffic analyzer receives simulation data of memory traffic by various master controllers (e.g., controllers 102) to memory 108 via the memory controller 106. In certain embodiments, the simulation data of system traffic includes information about data transactions (e.g., read/write operations) by the master controllers (e.g., master controllers 102 of FIG. 1) to memory (e.g., memory 108 of FIG. 1). The simulation data provides a sample of system traffic for the traffic analyzer to analyze.

At 404, the traffic analyzer selects a bank group subset of bits for an optimal memory address mapping. As mentioned, the traffic analyzer uses a two-stage approach to determine the optimal memory address mapping, and the first stage includes selecting the bank group bits of the optimal memory address mapping. In certain embodiments, the traffic analyzer selects the bank group bits by analyzing the received simulation data. Further details about selecting the bank group bits are provided below with respect to FIGS. 5a-5d.

At 406, the traffic analyzer selects a bank address subset of bits for an optimal memory address mapping. The second stage of the traffic analyzer's approach includes selecting the bank bits of the optimal memory address mapping. Similar to the first stage, in certain embodiments, the traffic analyzer selects the bank bits by analyzing the received simulation data. Further details about selecting the bank address bits are provided below with respect to FIGS. 6a-6d.

At 408, the traffic analyzer selects a column subset of bits for an optimal memory address mapping. In certain embodiments, the second stage includes selecting the column bits of the optimal memory address mapping. Once the traffic analyzer has selected the bank group bits and the bank bits, the remaining bits of the optimal memory address mapping are meant for the column bits and the row bits to identify a memory location. In certain embodiments, selecting the column bits of the optimal memory address mapping also indicates the row bits of the optimal memory address mapping. Further details about selecting the column bits are provided below with respect to FIGS. 6a-6d.

At 410, the traffic analyzer generates an optimal memory address mapping for converting system memory addresses to local memory addresses. Once the traffic analyzer has selecting the bank group bits, the bank bits, the column bits, and the row bits for the optimal memory address mapping, the traffic analyzer generates an optimal memory address mapping that identifies which bits of a system address are supposed to be for the bank group bits, the bank bits, the column bits, and the row bits, as illustrated in the memory address mapping 300 of FIG. 3.

At 412, the traffic analyzer uses the optimal memory address mapping at runtime to map data accesses by various I/O controllers. In certain embodiments, the memory controller 106 has the generated optimal memory address mapping which identifies the bank group, bank, row, and column of data locations in memory 108, and when the memory controller 106 receives a system memory address from a master controller (e.g., master controllers 102 of FIG. 1), the memory controller 106 maps the system memory address from the master controller using the optimal memory address mapping by converting the system memory address to a local memory address. By converting the system memory address to a local memory address, the memory controller can quickly find the particular memory location.

Figure 5A:
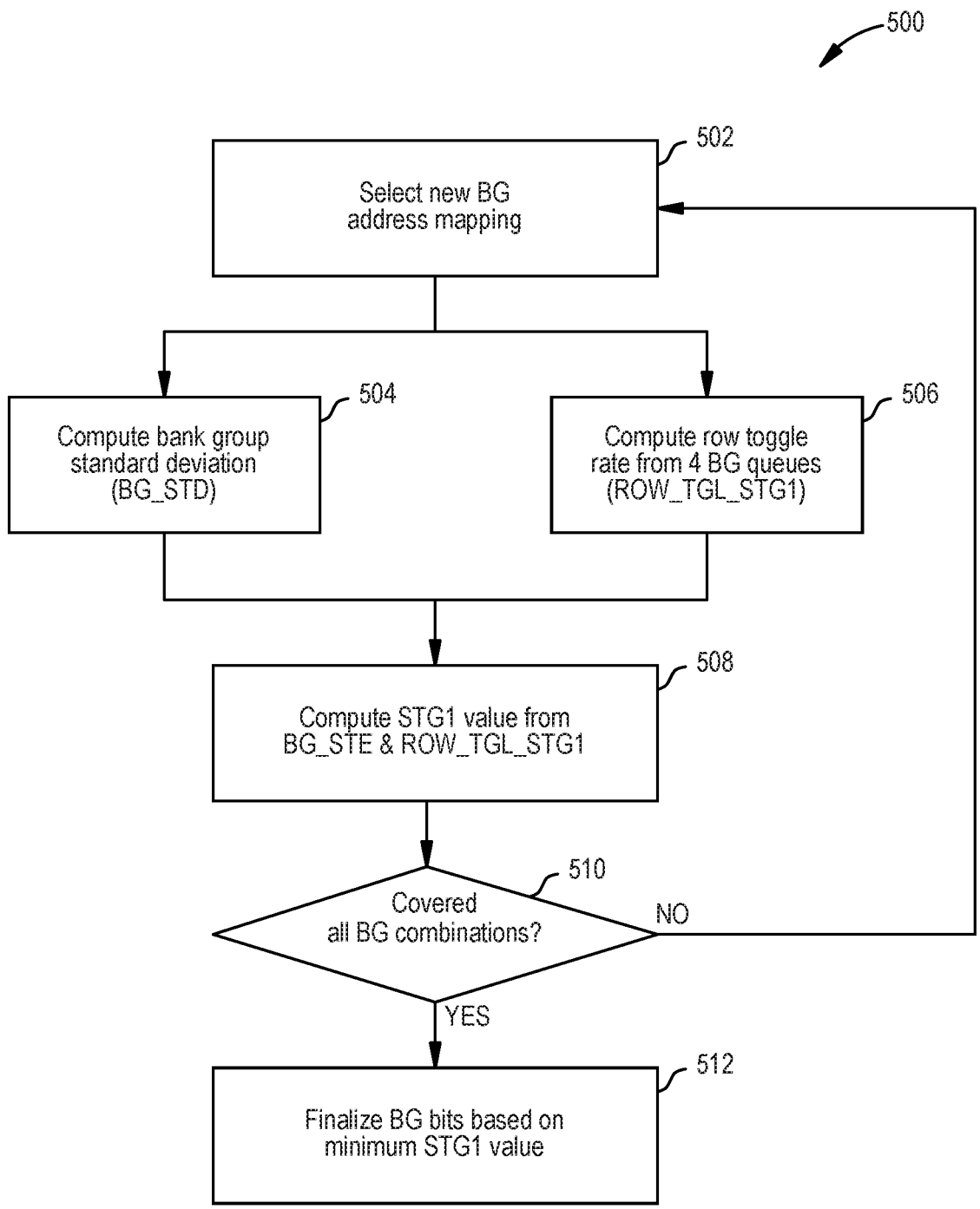
FIG. 5a illustrates example of the first stage of the traffic analyzer's two-stage approach performed by a memory controller, according to embodiments of the present disclosure.

FIG. 5a illustrates example operations performed by a traffic analyzer to select the bank group bits of an optimal memory address mapping, as a part of the traffic analyzer's two-stage approach. Specifically, FIG. 5a illustrates operations for the first stage of the traffic analyzer's two-stage approach. In some embodiments, step 404 of operations 400 comprises operations 500 for selecting the bank group bits of the optimal memory address mapping.

Even though the traffic analyzer has already reduced the number of computations to analyze using the two-stage approach, the traffic analyzer still needs to perform a significant number of computations to analyze memory traffic and determine the optimal memory address mapping. Specifically, because memory performance is directly proportional to the switching of the bank groups and open page hits, computation of the respective address overheads is required. The traffic analyzer computes these overheads for various possible address mappings, and determines the mapping that has the least access overhead. Because there are a large number of permutations and combinations of address mappings, the computational time is also proportionally large. In one embodiment, the traffic analyzer computes the overhead metrics separately.

In certain embodiments, the traffic analyzer performs operations 500 to execute the first stage of the two-stage approach to analyze memory traffic and to determine the optimal memory address mapping. In the first stage, the traffic analyzer computes the overhead metrics for bank groups and selects the bits of the optimal memory address mapping optimal for bank groups. Specifically, the traffic analyzer iterates through the required bank group address mappings to analyze patterns of system traffic and select bank group bits. To select the bank group bits, the traffic analyzer computes the bank group standard deviation and the row toggle rate as illustrated in FIG. 5a. The number of combinations for computation in the first stage of the traffic analyzer's two-stage approach is C(A, 2).

Operations 500 begin, at 502, when the traffic analyzer selects a new bank group address mapping. In certain embodiments, the traffic analyzer selects a bank group address mapping from all possible bank group mappings. In some embodiments, a bank group address mapping is a memory address mapping with bank group bits occupying certain bit positions for a system memory address. An example of a bank group address mapping is one where the bank group bits are bits 28 and 27 of a 29 bit system memory address.

At 504, the traffic analyzer computes a bank group standard deviation. As system performance is proportional to the bank group switching, it is required to have uniform distribution of the bank group accesses across the transaction sequence. To get a uniform distribution of bank group access, the traffic analyzer measures the standard deviation of transactions to each bank group of memory based on the currently selected bank group address mapping that the traffic analyzer chose at step 502. In one embodiment, the traffic analyzer computes the standard deviation based on the count of bank group hits within a given window. Details about computing the standard deviation metric for the bank groups are provided with respect to FIG. 5b.

Figure 5B:
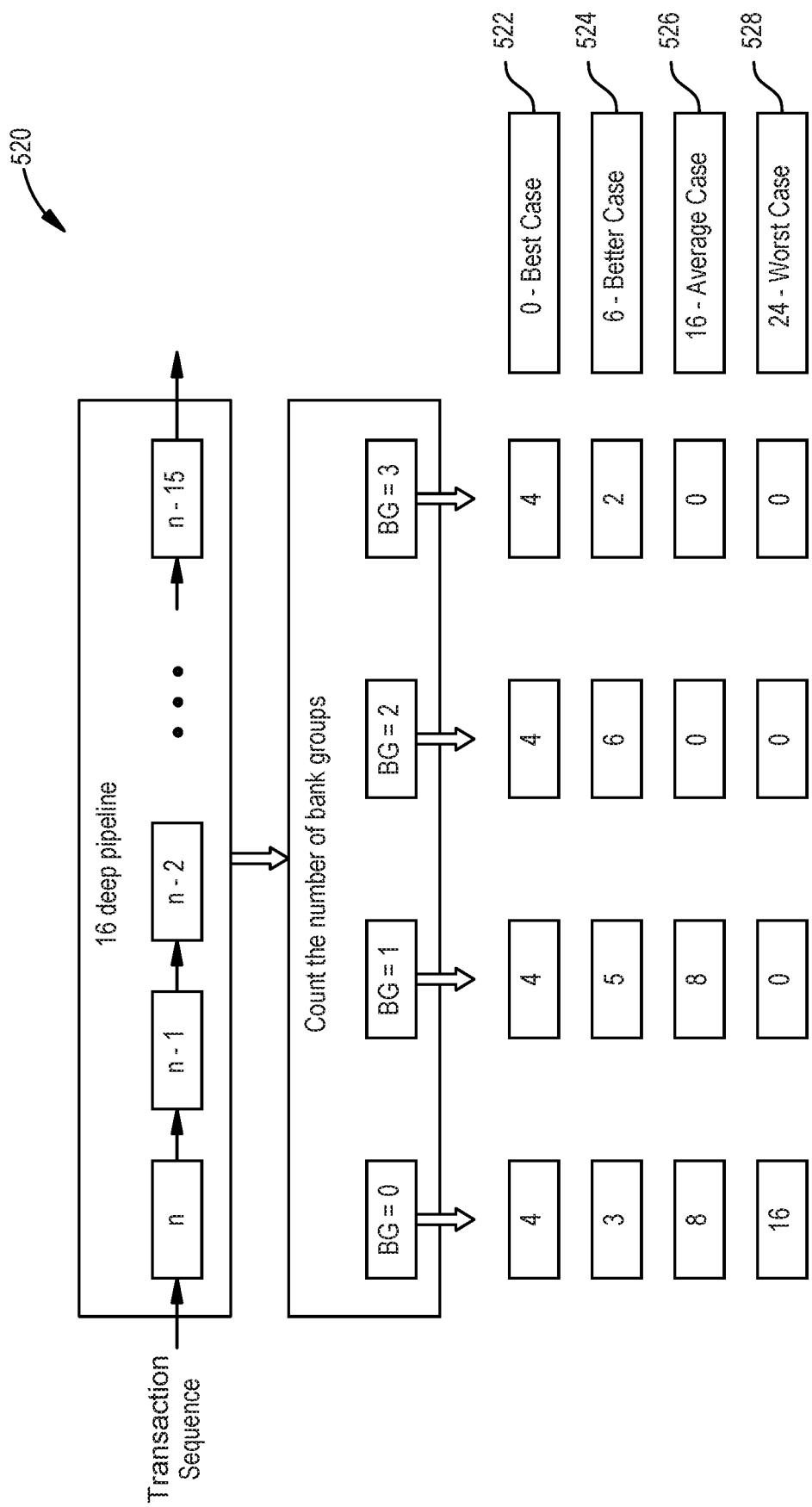
FIG. 5b illustrates an example of the bank group standard deviation computation performed by a memory controller, according to embodiments of the present disclosure.

FIG. 5b illustrates an example of the bank group standard deviation computation performed by a traffic analyzer, according to embodiments of the present disclosure. As mentioned, the traffic analyzer computes the standard deviation based on the count of bank group hits within a given window. FIG. 5b illustrates a 16 transaction-deep pipeline window for the bank group standard deviation computation.

The traffic analyzer computes the standard deviation by adding the absolute difference in the bank group hit count with respect to the best case values for each of the bank groups in a given window. FIG. 5b illustrates a few example case values. For the illustrated 16-transaction-deep pipeline window, the best case standard deviation 522 is 0 where the 16 transactions comprises 4 bank group hits to Bank Group 0, 4 bank group hits to Bank Group 1, 4 bank group hits to Bank Group 2, and 4 bank group hits to Bank Group 3.

Generally, for any number of transactions, the traffic analyzer does not determine the best case standard deviation 522. The traffic analyzer generally gets the average case 526, such as the average case in FIG. 5B comprising 8 bank group hits to Bank Group 0, 8 bank group hits to Bank Group 1, none to Bank Group 2, and none to Bank Group 3. With this distribution of bank group hits, the traffic analyzer determines that the standard deviation is 16. Occasionally, the system traffic has a transaction pipeline that has a better distribution of bank group hits, such as the better case 524 of FIG. 5b with 3 bank group hits to Bank Group 0, 5 bank group hits to Bank Group 1, 6 bank group hits to Bank Group 2, and 2 bank group hits to Bank Group 3. With this better case distribution of bank group hits, the traffic analyzer determines that the better case standard deviation is 6. However, sometimes, the distribution of bank groups gives the worst case standard deviation 528. The worst case standard deviation 528 is 24 where the 16 transactions comprises 16 bank group hits to Bank Group 0, none to Bank Group 1, none to Bank Group 2, and none to Bank Group 3.

For the best results, the/traffic analyzer computes the bank group standard deviation over a smaller rolling window STD[n] across the transaction sequence, "n" being the transaction number. Adding the bank group standard deviations from all rolling windows across the transaction sequence gives the cumulative bank group standard deviation BG_STD. In one embodiment, the memory controller performance efficiency increases as the value of BG_STD decreases.

Furthermore, in some embodiments, the memory controller looks at the order of the bank group hits in the pipeline window. In some embodiments the traffic analyzer can reorder transactions of the pipeline window in order to interleave.

Returning to FIG. 5a, at 506, the traffic analyzer computes a row toggle rate for the bank group queues based on the bank group address mapping. In one embodiment, the memory controller computes the row toggle rate for each bank group queue in order to reduce the number of computations performed. Because memory addresses can have different bank group address maps with the same bank group standard deviation and different row toggle rates, the memory controller needs to consider row toggle rate for bank groups. Details about computing the bank group-based row toggle rates are provided with respect to FIGS. 5c and 5d.

Figure 5C:
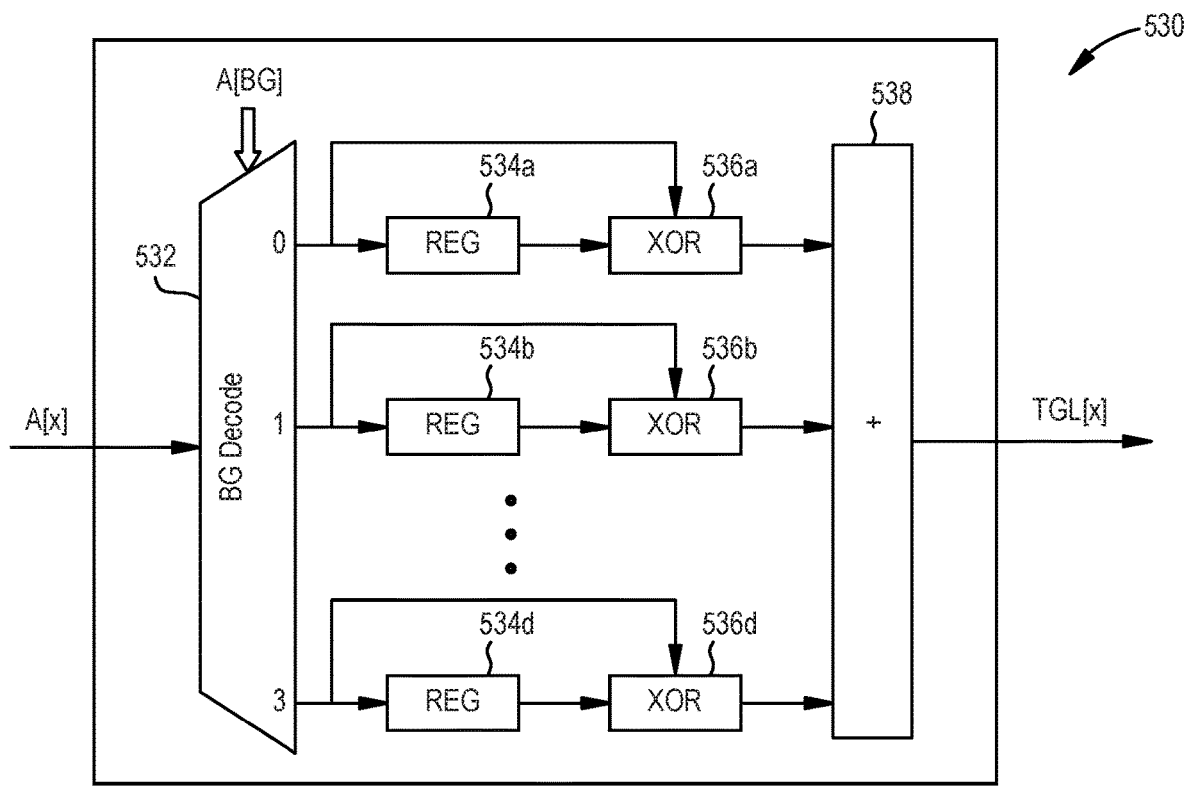
FIG. 5c illustrates an example of the bank group based address toggle rate computation performed by a memory controller, according to embodiments of the present disclosure.

FIG. 5c illustrates an example of the bank group-based address bit toggle rate computation performed by the traffic analyzer for the first stage of the traffic analyzer's two-stage approach, which the traffic analyzer computes alongside the bank group standard deviation computation as illustrated in FIG. 5b, according to embodiments of the present disclosure. In certain embodiments, the traffic analyzer computes the bank group-based address bit toggle rate concurrently with the bank group standard deviation.

The bank group-based address bit toggle rate computation helps with the bank group-based row toggle rate computation, which in turn assists in measuring page miss overhead. In certain embodiments, the bank group-based address bit toggle rate measures how often certain bits of a system memory address switch/toggle from zero to one and from one to zero. By measuring this frequency, the traffic analyzer has a measurement of which address bits have a higher toggle rate compared to others.

In certain embodiments, to determine the bank group-based address bit toggle rate, the traffic analyzer takes the system memory addresses of sample system traffic (each system memory address represented by an array A of bits) and decodes each bit of each system memory address using the bank group bits via bank group decoder 532. By decoding each bit of each system memory address of the sample system traffic using the bank group bits, the traffic analyzer determines how often each bit of a system memory address toggles for each bank group. In certain embodiments, decoding each bit using the bank group bits generates bank group queues.

As illustrated in FIG. 5c, the traffic analyzer determines the bank group of the system memory address, and passes the system memory address to a corresponding register 534 (534a, 534b, 534c, 534d), which stores the system memory address, and XOR 536 (536a, 536b, 536c, 536d). The traffic analyzer then compares the system memory address with another memory address from the register 534 via a XOR 536. In certain embodiments, the comparison of system memory addresses by the XOR 536 produces an array of toggled address bits. By comparing one memory address to another memory address, the traffic analyzer can determine which bits of the system memory addresses of the sample system traffic are switched/toggled the most and the least.

In certain embodiments, after the traffic analyzer compares a system memory address with another memory address, the traffic analyzer consolidates the results of the comparison via an accumulator 538. The accumulator 538 sums up the results from the XOR 536, which represents the number of occurrences that a particular bit toggles from zero to one or from one to zero, over the entire transaction pipeline (e.g., sample system data). In certain embodiments, the traffic analyzer stores the consolidated results of toggles for each address bit in an array TGL of bits. Using the array TGL, the traffic analyzer uses the consolidated row toggle rates to determine the bank group bits of an optimal memory address mapping.

Figure 5D:
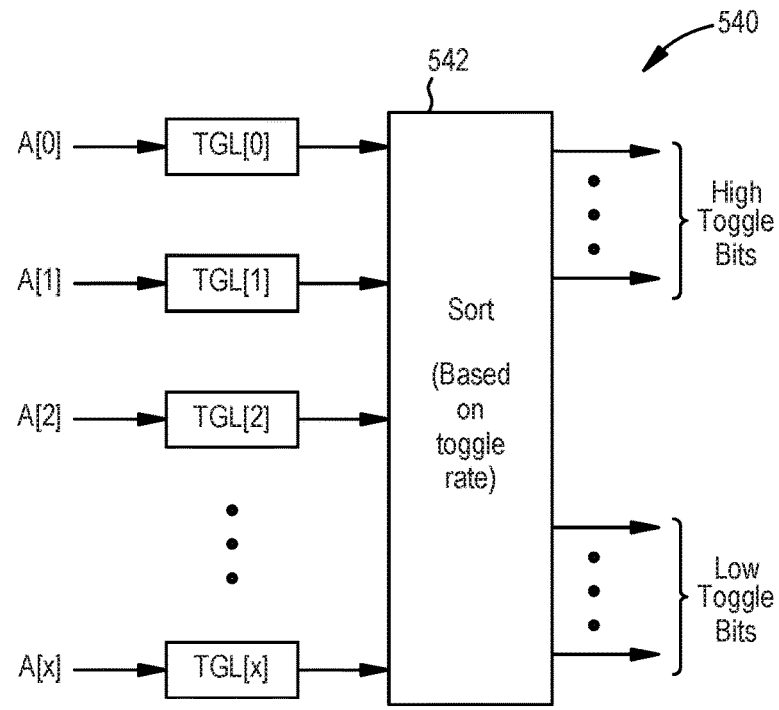
FIG. 5d illustrates an example of the row and column bit selection process performed by a memory controller, according to embodiments of the present disclosure.

FIG. 5d illustrates an example of the bank group-based row toggle rate computation performed by the traffic analyzer after the traffic analyzer computes the address bit toggle rate computation as illustrated in FIG. 5b, according to embodiments of the present disclosure. In certain embodiments, the traffic analyzer computes the bank group-based row toggle rate concurrently with the bank group standard deviation.

As mentioned, the bank group-based row toggle rate computation helps in measuring the page miss overhead. In certain embodiments, the bank group-based row toggle rate is a measurement of how often a different row of a bank of the bank group is accessed. Specifically, by measuring the frequency a different row of a bank of the bank group is accessed, the traffic analyzer can select which address bits for memory address mapping are optimal for identifying bank groups in memory.

To determine the bank group-based row toggle rate, the traffic analyzer takes the array of consolidated toggles for each bit of the system addresses of the sample system data (represented by array TGL) and sorts each consolidated toggle rate based on the toggle rate. The traffic analyzer then takes the consolidated row toggle rate based on the bank group address mapping chosen in step 502 of operations 500 to use for computing the first stage value.

Returning to FIG. 5a, at 508, the traffic analyzer computes a first stage value based on the bank group standard deviation and on the bank group-based row toggle rate for the bank group queues. In certain embodiments, the first stage value is a computation based on weighing the bank group standard deviation and the bank group-based row toggle rate. In the first stage of the two-stage approach, the traffic analyzer gives more weight to the bank group standard deviation compared to the bank group-based row toggle rate. In certain embodiments, the traffic analyzer computes multiple first stage values based on different bank group address mappings.

At 510, the traffic analyzer determines whether the memory controller has covered all bank group address mappings. Because the traffic analyzer needs to iterate through all possible bank group mapping, the traffic analyzer needs to determine if there are any bank group address mappings that have not been used in the first stage. In some embodiments, the traffic analyzer uses a counter for the number of bank group address mappings to cover.

If traffic analyzer has not covered all bank group combinations, the traffic analyzer replays step 502.

If traffic analyzer has covered all bank group combinations, the traffic analyzer finalizes the bank group bits based on the first stage value computed at step 508. In certain embodiments, the traffic analyzer determines multiple first stage values based on different bank group address mappings, and the traffic analyzer, from the multiple first stage values, selects the bank group bits based on the minimum first stage value. For example, the minimum first stage value corresponds to bits 4 and 3 of the system memory address, and the traffic analyzer selects bits 4 and 3 for the bank group bits, as illustrated in the memory address mapping of FIG. 3.

Figure 6A:
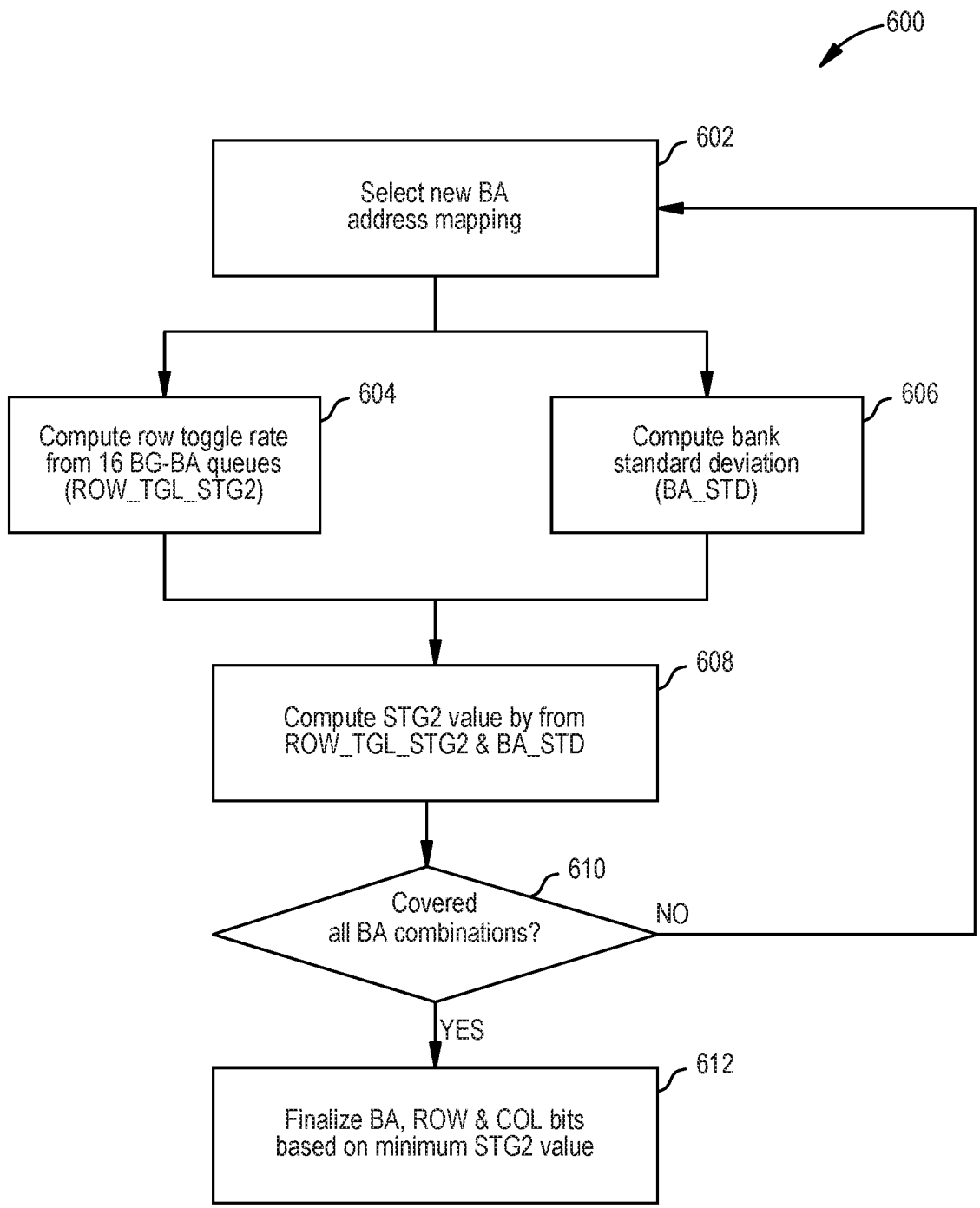
FIG. 6a illustrates example of the second stage of the traffic analyzer's two-stage approach performed by a memory controller, according to embodiments of the present disclosure.

FIG. 6a illustrates example operations performed by a traffic analyzer to select the bank bits of an optimal memory address, as a part of the traffic analyzer's two-stage approach, after the bank group bits have been selected as disclosed in FIG. 5a-5d, according to embodiments of the present disclosure. In some embodiments, step 406 and step 408 of operations 400 comprises operations 600 for selecting the bank bits of the optimal memory address mapping, and selecting the column bits of the optimal address mapping.

In certain embodiments, the traffic analyzer performs operations 600 to execute the second stage of the two-stage approach to analyze memory traffic and to determine the optimal memory address mapping. In the second stage, the traffic analyzer computes the overhead metrics for the banks of the bank groups. Specifically, the traffic analyzer iterates through the required bank address mappings to analyze traffic patterns and select the bank bits. To select the bank bits, the traffic analyzer computes the bank standard deviation, and the bank-based row toggle rate as illustrated in FIG. 6a. The number of combinations for computation in the second stage of the traffic analyzer's two-stage approach is C(A−2,2). In certain embodiments, the traffic analyzer also selects the row and column bits for the optimal memory address mapping.

Operations 600 begin, at 602, when the traffic analyzer selects a new bank address mapping. In certain embodiments, the traffic analyzer selects a bank address mapping from all possible bank address mappings. In some embodiments, a bank address (BA) mapping is a memory address mapping with bank bits occupying certain bit positions for a system memory address. An example of a bank address mapping is one where the bank bits are bits 5 and 6 of a 29 bit system memory address.

At 606, the traffic analyzer computes a bank address standard deviation. Similar to the first stage, system performance is proportional to bank accesses, and thus a uniform distribution of bank accesses is optimal. Accordingly, the traffic analyzer measures the standard deviation of transactions to each bank of memory to get a uniform distribution of bank accesses based on the bank address mapping that the traffic analyzer selected in step 602. In one embodiment, the traffic analyzer computes the standard deviation based on the count of bank hits within a given window per bank group. Details about computing the standard deviation metric for the banks are provided with respect to FIG. 6b.

Figure 6B:
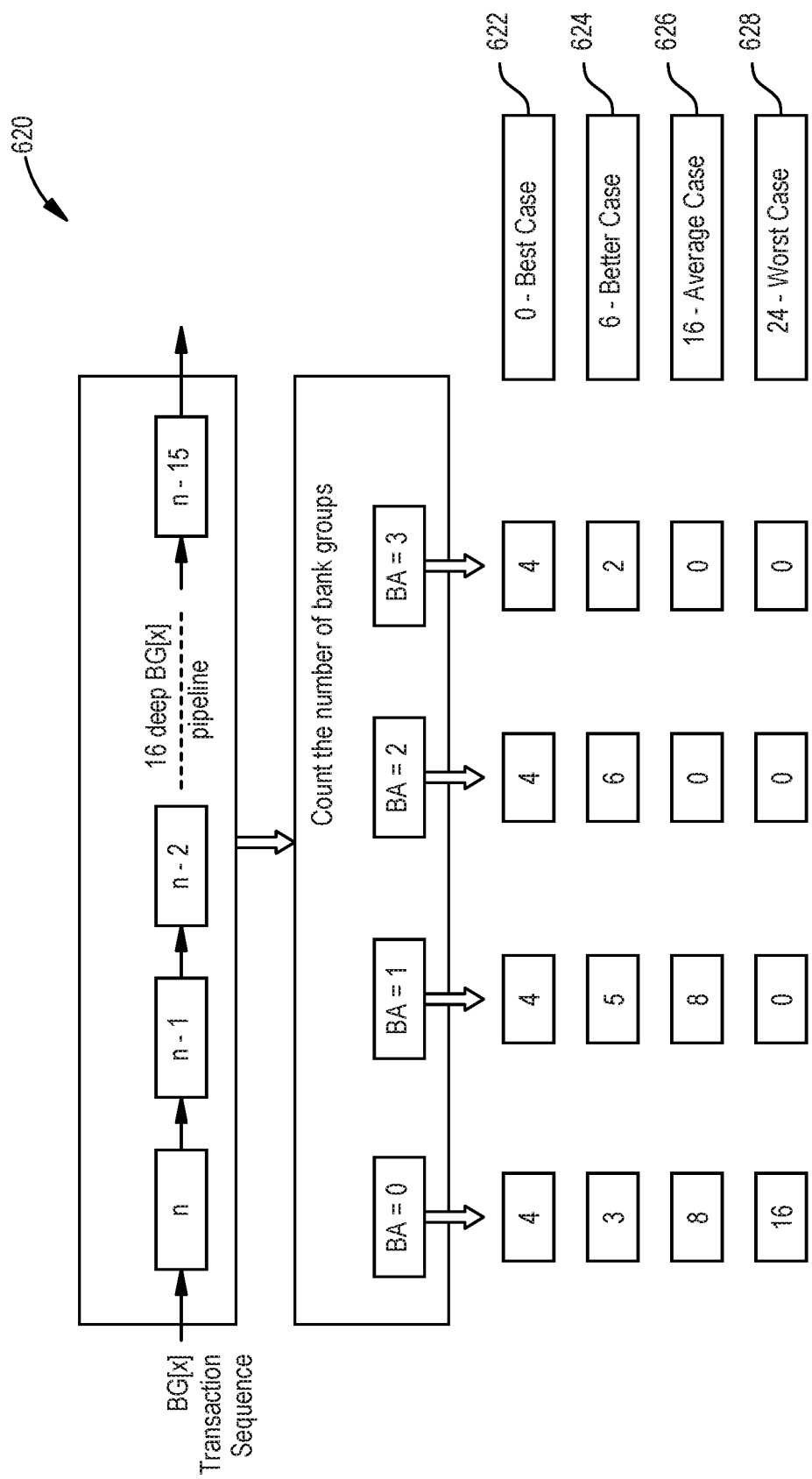
FIG. 6b illustrates an example of the bank address standard deviation computation performed by a memory controller, according to embodiments of the present disclosure.

FIG. 6b illustrates an example of the bank address standard deviation computation performed by a traffic analyzer, according to embodiments of the present disclosure. As mentioned, the traffic analyzer computes the standard deviation based on the count of bank hits within a given window per bank group. FIG. 6b illustrates a 16 transaction deep pipeline window for the bank standard deviation computation.

The traffic analyzer computes the standard deviation by adding the absolute difference in the bank hit counts with respect to the best case values for each of the banks in a given window. FIG. 6b illustrates a few example case values. For the illustrated 16 transaction deep pipeline window, the best case standard deviation 622 is 0 where each of the 16 transactions comprises banks hits to different banks of one bank group.

Generally, for any number of transactions, the traffic analyzer does not determine the best case standard deviation 622. The traffic analyzer generally gets the average case, such as the average case 626 in FIG. 6b comprising 8 bank hits to Bank 0, 8 bank hits to Bank 1, 0 bank hit to Bank 2, and 0 bank hits to Bank 3. With this distribution of bank hits, the traffic analyzer determines that the standard deviation is about 16 for the banks of a bank group. Occasionally, the system traffic has a transaction pipeline that has a better distribution of bank hits, such as the better case 624 of FIG. 6b with 3 bank hit to Bank 0, 5 bank hits to Bank 1, 6 bank hit to Bank 2, and 2 bank hits to Bank 3. With this better case 624 distribution of bank hits, the traffic analyzer determines the better case 624 distribution is 6 for the banks of one bank group. However, sometimes, the distribution of bank hits gives the worst case standard deviation. The worst case standard deviation 628 is 24 where the 16 transactions comprise 16 bank hits to Bank 0 of one bank group and none to the other banks of the same bank group.

For the best results, the traffic analyzer computes the bank standard deviation over a smaller rolling window STD[n] across the transaction sequence per bank group, "n" being the transaction number. Adding the bank standard deviations from all rolling windows across the transaction sequence gives the cumulative bank standard deviation BG-BA_STD. In one embodiment, performance efficiency increases as the value of BG-BA_STD decreases.

Returning to FIG. 6a, at 604, the traffic analyzer computes a bank-based row toggle rate for the bank address queues based on the bank address mapping. The bank-based row toggle rate computation helps in measuring page miss overhead. Similar to the bank standard deviation, a lower bank-based row toggle rate results in higher system performance. The traffic analyzer computes the bank-based row toggle rate (TGL) for all available address bits as illustrated in FIG. 6c.

In one embodiment, the traffic analyzer computes the bank-based row toggle rate for each bank queue. In the second stage, the row toggle rate is given high priority. Because memory addresses can have different bank address maps with the same row toggle rate and different bank standard deviation, the traffic analyzer needs to consider the bank standard deviation at a lower priority.

The traffic analyzer computes the bank-based address bit toggle rate for each of the sixteen banks separately and processes the results to get a consolidated toggle rate. The traffic analyzer considers the low toggling address bits for the row bits to achieve less row switching, and considers the high toggling address bits for column bits as illustrated in FIG. 6d. The traffic analyzer derives the bank-based row toggle rate ROW_TGL from the address bit toggle rates of all the row bits.

Figure 6C:
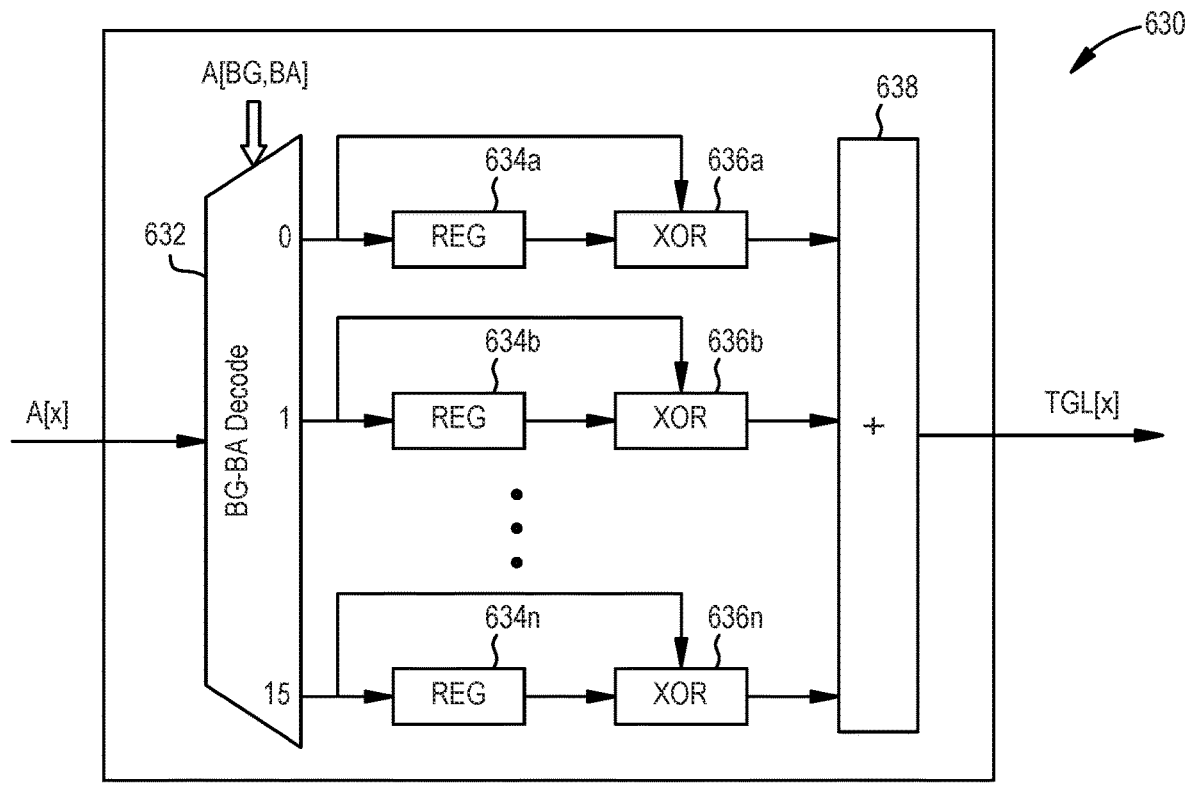
FIG. 6c illustrates an example of the bank based address toggle rate computation performed by a memory controller, according to embodiments of the present disclosure.
Figure 6D:
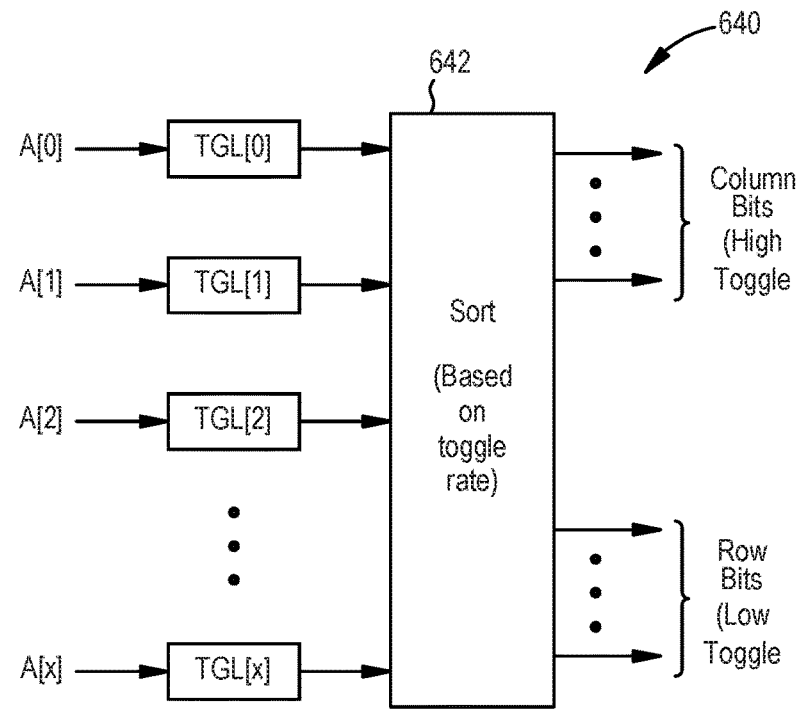
FIG. 6d illustrates an example of the row and column bit selection process performed by a memory controller, according to embodiments of the present disclosure.

Details about computing bank-based address bit and row toggle rates are provided with respect to FIGS. 6c and 6d.

FIG. 6c illustrates an example of the bank-based address toggle rate computation performed by a traffic analyzer for the second stage of the traffic analyzer's two-stage approach, which the traffic analyzer computes alongside the bank standard deviation computation as illustrated in FIG. 6b, according to embodiments of the present disclosure. In certain embodiments, the traffic analyzer computes the bank-based address bit toggle rate concurrently with the bank standard deviation.

As mentioned, bank-based address bit toggle rate computation helps with the row toggle rate computation, which in turn assists in measuring page miss overhead. In certain embodiments, the bank-based address bit toggle rate is a measurement of how often certain bits of a system memory address switch/toggle from zero to one and from one to zero, By measuring the frequency of the bits of the system memory address toggling from zero to one and from one to zero, the traffic analyzer can determine which bits have a higher toggle rate compared to other bits, and can then decide which bits of a system memory address should be used for identifying banks. Similarly, the traffic analyzer uses the bank-based address bit toggle rate to determine which bits of a system memory address should be used for identifying the column and the row of a particular memory location.

To determine the bank-based address bit toggle rate, the traffic analyzer takes the system memory addresses of sample system traffic and decodes each bit of each system memory address using the bank bits and the bank group bits via a bank decoder 632. By decoding the system memory addresses of the sample system traffic using bank bits and the bank group bits, the traffic analyzer determines how often each bit of system memory addresses toggles for each bank of each bank group. In certain embodiments, decoding each bit using the bank bits and the bank group bits generates bank queues.

In certain embodiments, the traffic analyzer determines the bank of the system memory address, and passes each bit to a register 634 (634a-634n), which stores the address bit for use with the corresponding address bit of the next memory address of the sample system traffic. In certain embodiments, the traffic analyzer uses a register 634 for each bank queue corresponding to each bank. The traffic analyzer then compares the address bit with a corresponding address bit of another memory address from the register 634 via a XOR 636 (636a-636n). In certain embodiments, the traffic analyzer uses a XOR 636 for each bank queue corresponding to each bank. By comparing multiplexed memory addresses against each other, the traffic analyzer can determine which bits of the system memory addresses of the sample system traffic are switched/toggled the most and the least.

In certain embodiments, after the traffic analyzer compares the multiplexed memory addresses with another multiplexed memory address, the traffic analyzer consolidates the results of the comparison via an accumulator 638. The accumulator 638 sums up the results from the XOR 636, which represents the number of occurrences that a particular bit toggles from zero to one or from one to zero, over the entire transaction pipeline (e.g., sample system data). In certain embodiments, the traffic analyzer stores the consolidated results of toggles for each address bit in an array TGL of bits corresponding to each address bit. Using the array TGL, the traffic analyzer uses the consolidated address bit toggle rate to select the bank bits of an optimal memory address mapping.

In some embodiments, the traffic analyzer also uses the consolidated address bit toggle rates to select the column bits and row bits of an optimal memory address mapping.

FIG. 6d illustrates an example of the bank-based row toggle rate computation performed by a traffic analyzer after the traffic analyzer computes the address bit toggle rate computation as illustrated in FIG. 6c, according to embodiments of the present disclosure. In certain embodiments, the bank-based row toggle rate is a measurement of how often a different row of a bank of the bank group is accessed. Specifically, by measuring the frequency a different row of a bank of the bank group is accessed, the traffic analyzer can select the address bits for memory address mapping are optimal for identifying bank in memory.

To determine the bank-based row toggle rate, the traffic analyzer takes the array of consolidated toggle rates for each bit of the system addresses of the sample system data (represented by array TGL) and sorts each consolidated address bit toggle rate based on the toggle rate. The traffic analyzer then takes the consolidated toggle rate based on the bank address mapping chosen in step 602 of operations 600 to use for computing the second stage value.

Returning to FIG. 6a, at 608, the traffic analyzer computes second stage value based on the bank address standard deviation and on the row toggle rate for the bank address queues. In certain embodiments, the second stage value is a computation based on weighing the bank standard deviation and the bank-based row toggle rate. In the second stage, as compared to the first stage of the two-stage approach, the traffic analyzer gives less weight to the bank standard deviation compared to the bank-based row toggle rate. In certain embodiments, the traffic analyzer computes multiple second stage values based on different bank address mappings.

At 610, the traffic analyzer determines whether the traffic analyzer has covered all bank address combinations. Because the traffic analyzer needs to iterate through all possible bank address mappings, the traffic analyzer needs to determine if there are any bank address mappings that have not been used in the second stage. In some embodiments, the traffic analyzer uses a counter for the number of bank address mappings to cover.

If traffic analyzer has not covered all bank address combinations, the traffic analyzer replays step 602.

If traffic analyzer has covered all bank address combinations, the traffic analyzer finalizes the bank address bits based on the second stage value computed at step 608. In certain embodiments, the traffic analyzer determines multiple second stage values based on different bank address mappings, and the traffic analyzer, from the multiple second stage values, selects the bank address bits based on the minimum second stage value. For example, the minimum first stage value corresponds to bits 6 and 5 of the system memory address, and the traffic analyzer selects bits 6 and 5 for the bank group bits, as illustrated in the memory address mapping of FIG. 3.

In some embodiments, once the traffic analyzer has selected the bank address bits, the traffic analyzer can proceed with selecting the column bits and the row bits of the optimal memory address mapping. In certain embodiments, the traffic analyzer takes the high toggling bits of the bank-based address toggle rate for the column bits, and the low toggling bits of the bank-based address toggle rate for the row bits. In such embodiments, the traffic analyzer uses lower toggling bits for the row bits to avoid toggling of the row bits and thus reduce page miss overhead For example, the traffic analyzer has already selected bits 3-4 for bank group bits and bits 5-6 for bank bits, as illustrated in the memory address mapping of FIG. 3, and goes on to select column and row bits. In this example, bits 7-13 and 0-2 correspond to a higher row toggling rate compared to bits 14-28, and so the traffic analyzer selects bits 7-13 and 0-2 as the column bits, also illustrated in the memory address mapping of FIG. 3. Once the traffic analyzer selects the column bits, the traffic analyzer uses the remaining bits of the system memory address for the row bits (bits 14-28) and generates the memory address mapping using the selected bank group bits, bank bits, column bits, and row bits, such as the memory address mapping of FIG. 3.

Figure 7:
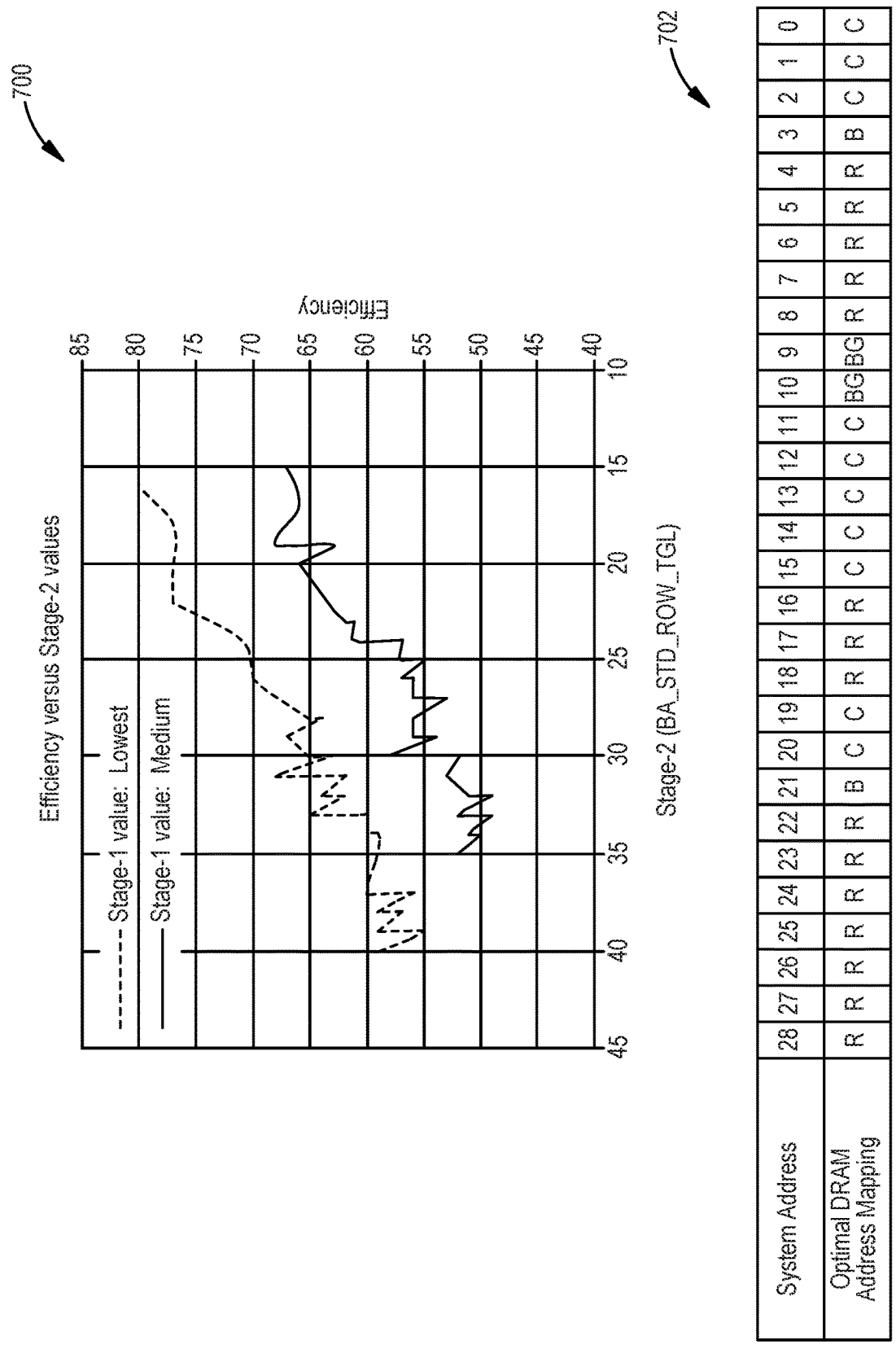
FIG. 7 illustrates memory efficiency using an example memory address mapping, according to embodiments of the present disclosure.

FIG. 7 is a graph of memory efficiency using an example memory address mapping generated by the disclosed traffic analyzer, according to embodiments of the present disclosure. FIG. 7 specifically illustrates a graph 700 of the efficiency results in a multiple master controller and single slave system use case, where the master controllers include a video decoder, a display controller, and a DMA controller and these controllers access DRAM memory. Each of these master controllers have different traffic patterns, access rates, and timing, and so the memory traffic becomes complex to predict and manually determining the optimal memory address mapping is difficult. Thus, the traffic analyzer analyzes the sample system traffic and generated a memory address mapping 702. FIG. 7 captures the efficiency results of various address mappings exercised during the second stage of the traffic analyzer's two-stage approach. As illustrated, the memory efficiency increases as values from the second stage decrease. FIG. 7 illustrates two different bank group address mappings from the first stage of the traffic analyzer's two-stage approach, and the lowest value from the first stage results in better memory efficiency.

Figure 8:
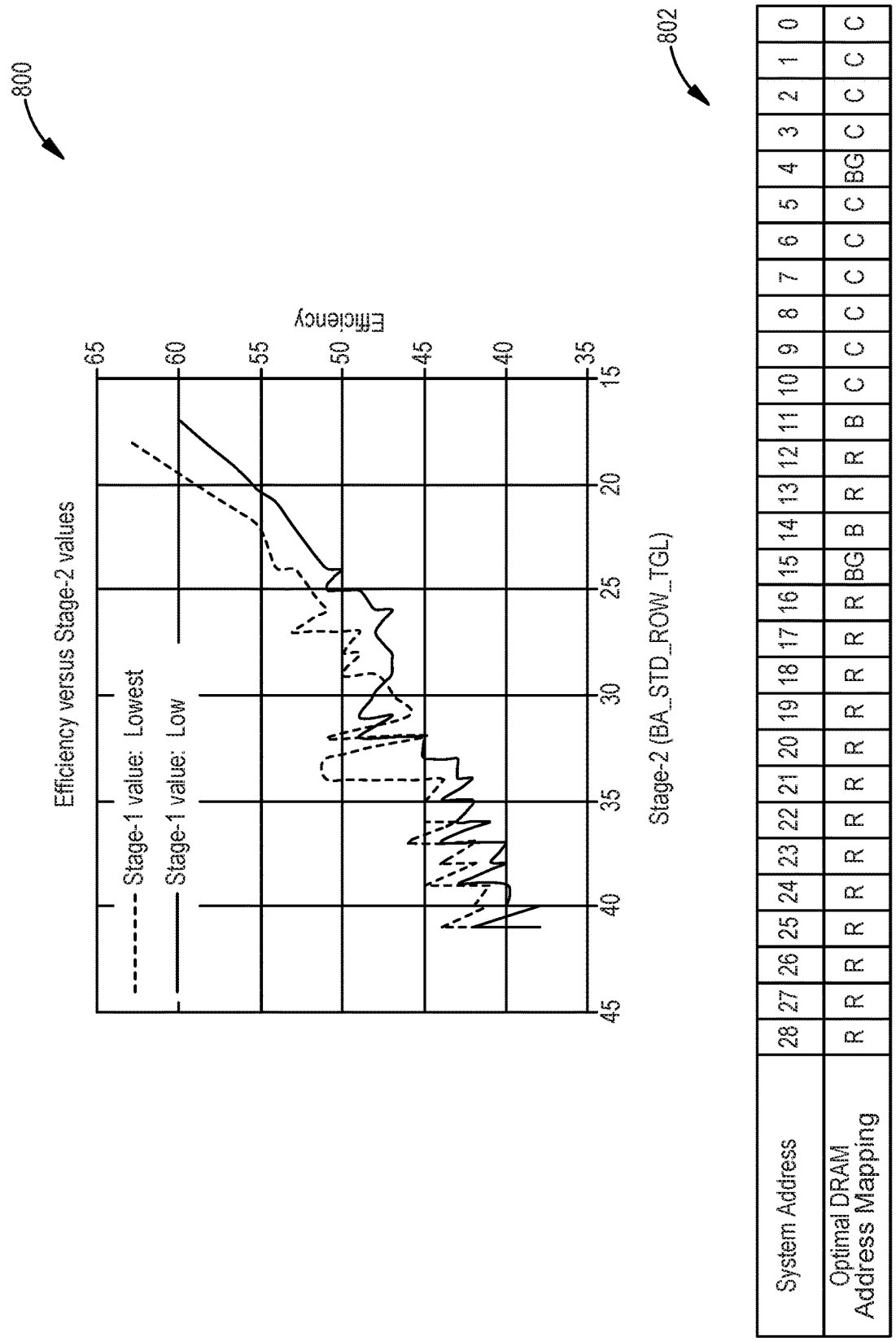
FIG. 8 illustrates memory efficiency using an example memory address mapping, according to embodiments of the present disclosure.

FIG. 8 illustrates memory efficiency using an example memory address mapping, according to embodiments of the present disclosure. FIG. 8 specifically illustrates a graph 800 of the efficiency results in a single master controller and single slave system use case, where the single master controller is a video decoder and it accesses DRAM memory. The traffic analyzer analyzes the sample system traffic and generated a memory address mapping 802. FIG. 8 captures the efficiency results for various address mappings exercised during the second stage of the traffic analyzer's two-stage approach. As illustrated, memory efficiency increases as the values from the second stage decrease. FIG. 8 illustrates two different bank group address mappings from the first stage of the traffic analyzer's two-stage approach, and the lowest value from the first stage results in better memory efficiency.

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method for memory address mapping, the method comprising:
    selecting a bank group subset of bits from a plurality of bits that represent a memory address, wherein determining the bank group subset comprises computing a standard deviation for a plurality of bank groups and a row toggle rate for each bank group when accessing data in the plurality of bank groups using a plurality of local memory addresses;
    selecting a bank address subset of bits from the plurality of bits by computing a standard deviation for a plurality of banks of each bank group and a row toggle rate for each bank of the plurality of banks of each bank group when accessing the data;
    selecting a column subset of bits from the plurality of bits using an address toggle rate for each bank of the plurality of banks, wherein the column subset of bits is exclusive from the bank group subset of bits and the bank address subset of bits; and
    generating an optimal memory address mapping for converting system memory addresses into the plurality of local memory addresses for the plurality of banks using the bank group subset of bits, the bank address subset of bits, and the column subset of bits.

2. The method of claim 1, further comprising: receiving simulation data for computing the standard deviation for the plurality of bank groups, the row toggle rate for each bank group, the standard deviation for the plurality of banks of each bank group, and the row toggle rate for the plurality of banks of each bank group.

3. The method of claim 1, wherein computing a standard deviation for a plurality of banks of each bank group comprises accumulating differences between bank hits as compared to a best case standard deviation for the plurality of banks of each bank group.

4. The method of claim 1, wherein computing the row toggle rate for each bank of the plurality of banks of each bank group comprises consolidating address toggle rates for each bank over a series of data accesses.

5. The method of claim 1, wherein determining the column subset comprises sorting the address toggle rates for the plurality of banks of each bank group based on toggle rate wherein the toggle rate comprises occurrences of data access to a particular bank.

6. The method of claim 1, further comprising selecting a row subset of bits in parallel with selecting the column subset of bits.

7. The method of claim 1, further comprising: mapping data accesses by a plurality of input/output (I/O) controllers using the generated optimal memory address mapping, wherein mapping comprises converting received memory addresses into local memory addresses during design configuration time.

8. A system for memory address mapping, comprising:
    a processor; and
    non-transitory computer-readable medium embodying computer program instructions for memory address mapping, the computer program instructions implementing a method, the method comprising:
        selecting a bank group subset of bits from a plurality of bits that represent a memory address, wherein determining the bank group subset comprises computing a standard deviation for a plurality of bank groups and a row toggle rate for each bank group when accessing data in the plurality of bank groups using a plurality of local memory addresses;

selecting a bank address subset of bits from the plurality of bits by computing a standard deviation for a plurality of banks of each bank group and a row toggle rate for each bank of the plurality of banks of each bank group when accessing the data;

selecting a column subset of bits from the plurality of bits using an address toggle rate for each bank of the plurality of banks, wherein the column subset of bits is exclusive from the bank group subset of bits and the bank address subset of bits; and generating an optimal memory address mapping for converting system memory addresses into the plurality of local memory addresses for the plurality of banks using the bank group subset of bits, the bank address subset of bits, and the column subset of bits.

9. The system of claim 8, wherein the method further comprises: receiving simulation data for computing the standard deviation for the plurality of bank groups, the row toggle rate for each bank group, the standard deviation for the plurality of banks of each bank group, and the row toggle rate for the plurality of banks of each bank group.

10. The system of claim 8, wherein computing a standard deviation for a plurality of banks of each bank group comprises accumulating differences between bank hits as compared to a best case standard deviation for the plurality of banks of each bank group.

11. The system of claim 8, wherein computing the row toggle rate for each bank of the plurality of banks of each bank group comprises consolidating address toggle rates for each bank over a series of data accesses.

12. The system of claim 8, wherein determining the column subset comprises sorting the address toggle rates for the plurality of banks of each bank group based on toggle rate wherein the toggle rate comprises occurrences of data access to a particular bank.

13. The system of claim 8, wherein the method further comprises selecting a row subset of bits exclusive from the column subset of bits.

14. The system of claim 8, further comprising: mapping data accesses by a plurality of input/output (I/O) controllers using the generated optimal memory address mapping, wherein mapping comprises converting received memory addresses into local memory addresses during design configuration time.

15. A non-transitory computer-readable medium embodying computer program instructions for memory address mapping, the computer program instructions implementing a method, the method comprising:

selecting a bank group subset of bits from a plurality of bits that represent a memory address, wherein determining the bank group subset comprises computing a standard deviation for a plurality of bank groups and a row toggle rate for each bank group when accessing data in the plurality of bank groups using a plurality of local memory addresses;

selecting a bank address subset of bits from the plurality of bits by computing a standard deviation for a plurality of banks of each bank group and a row toggle rate for each bank of the plurality of banks of each bank group when accessing the data;

selecting a column subset of bits from the plurality of bits using an address toggle rate for each bank of the plurality of banks, wherein the column subset of bits is exclusive from the bank group subset of bits and the bank address subset of bits; and generating an optimal memory address mapping for converting system memory addresses into the plurality of local memory addresses for the plurality of banks using the bank group subset of bits, the bank address subset of bits, and the column subset of bits.

16. The non-transitory computer-readable medium of claim 15, wherein the method further comprises: receiving simulation data for computing the standard deviation for the plurality of bank groups, the row toggle rate for each bank group, the standard deviation for the plurality of banks of each bank group, and the row toggle rate for the plurality of banks of each bank group.

17. The non-transitory computer-readable medium of claim 15, wherein computing a standard deviation for a plurality of banks of each bank group comprises accumulating differences between bank hits as compared to a best case standard deviation for the plurality of banks of each bank group.

18. The non-transitory computer-readable medium of claim 15, wherein computing the row toggle rate for each bank of the plurality of banks of each bank group comprises consolidating address toggle rates for each bank over a series of data accesses.

19. The non-transitory computer-readable medium of claim 15, wherein determining the column subset comprises sorting the address toggle rates for the plurality of banks of each bank group based on toggle rate wherein the toggle rate comprises occurrences of data access to a particular bank.

20. The non-transitory computer-readable medium of claim 15, further comprising: mapping data accesses by a plurality of input/output (I/O) controllers using the generated optimal memory address mapping, wherein mapping comprises converting received memory addresses into local memory addresses during design configuration time.

* * * * *